(12) United States Patent
Rai et al.

(10) Patent No.: US 12,417,921 B2
(45) Date of Patent: Sep. 16, 2025

(54) METHODS AND APPARATUS FOR IN-SITU PROTECTION OF ETCHED SURFACES

(71) Applicant: APPLIED MATERIALS, INC., Santa Clara, CA (US)

(72) Inventors: Shiva Rai, Fremont, CA (US); Alfredo Granados, San Antonio, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 555 days.

(21) Appl. No.: 17/116,335

(22) Filed: Dec. 9, 2020

(65) Prior Publication Data

US 2022/0181160 A1    Jun. 9, 2022

(51) Int. Cl.
*H01L 21/306* (2006.01)
*H01J 37/32* (2006.01)
(Continued)

(52) U.S. Cl.
CPC .. *H01L 21/30621* (2013.01); *H01J 37/32449* (2013.01); *H01L 21/67069* (2013.01);
(Continued)

(58) Field of Classification Search
CPC ......... H01L 21/30621; H01L 21/67069; H01L 31/02161; H01L 31/02167; H01L 31/03046; H01L 31/03048; H01L 31/035236; H01L 31/035281; H01L 31/1844; H01L 31/1848; H01L 31/1852;
(Continued)

(56) References Cited

U.S. PATENT DOCUMENTS

| 5,501,893 A | 3/1996 | Laermer et al. |
| 6,867,086 B1 | 3/2005 | Chen et al. |

(Continued)

FOREIGN PATENT DOCUMENTS

GB    2576108 A    2/2020

OTHER PUBLICATIONS https://en.wikipedia.org/wiki/Deep_reactive-ion_etching#Bosch_process.

*Primary Examiner* — Norman D Richards
*Assistant Examiner* — Sean Ayers Winters
(74) *Attorney, Agent, or Firm* — Moser Taboada

(57) ABSTRACT

Methods and apparatus for processing a photonic device are provided herein. For example, methods include etching, using a plasma etch process that uses a first gas, a first epitaxial layer of material of the photonic device comprising a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$), depositing, using a plasma deposition process that uses a second gas different from the first gas, a first dielectric layer over etched sidewalls of the first epitaxial layer of material, etching, using the first gas, a second epitaxial layer of material of the photonic device, and depositing, using the second gas, a second dielectric layer over etched sidewalls of the second epitaxial layer of material.

20 Claims, 4 Drawing Sheets

(51) Int. Cl.
- *H01L 21/67* (2006.01)
- *H10F 71/00* (2025.01)
- *H10F 77/124* (2025.01)
- *H10F 77/14* (2025.01)
- *H10F 77/30* (2025.01)
- *H10H 20/01* (2025.01)
- *H10H 20/812* (2025.01)
- *H10H 20/821* (2025.01)
- *H10H 20/824* (2025.01)
- *H10H 20/825* (2025.01)
- *H10H 20/84* (2025.01)

(52) U.S. Cl.
CPC ..... *H10F 71/1272* (2025.01); *H10F 71/1274* (2025.01); *H10F 71/1276* (2025.01); *H10F 77/1248* (2025.01); *H10F 77/12485* (2025.01); *H10F 77/146* (2025.01); *H10F 77/147* (2025.01); *H10F 77/306* (2025.01); *H10F 77/311* (2025.01); *H10H 20/0133* (2025.01); *H10H 20/01335* (2025.01); *H10H 20/812* (2025.01); *H10H 20/821* (2025.01); *H10H 20/824* (2025.01); *H10H 20/825* (2025.01); *H10H 20/84* (2025.01); *H01J 2237/332* (2013.01); *H01J 2237/3341* (2013.01); *H10H 20/034* (2025.01)

(58) Field of Classification Search
CPC ... H01L 33/0066; H01L 33/007; H01L 33/06; H01L 33/24; H01L 33/30; H01L 33/32; H01L 33/44; H01L 2933/0025; H01J 37/32449; H01J 2237/332; H01J 2237/3341; H10H 20/821; H10H 20/0133; H10H 20/825; H10H 20/824; H10H 20/84; H10H 20/01335; H10H 20/812; H10H 20/034; H10F 77/146; H10F 77/147; H10F 77/1248; H10F 71/1276; H10F 77/12485; H10F 77/311; H10F 71/1272; H10F 71/1274; H10F 77/306

See application file for complete search history.

(56) References Cited

U.S. PATENT DOCUMENTS

| | | | | |
|---|---|---|---|---|
| 7,224,015 | B1* | 5/2007 | Skotnicki | H10B 12/033 257/306 |
| 8,133,797 | B2 | 3/2012 | Van Schravendijk et al. | |
| 9,543,148 | B1 | 1/2017 | Hudson et al. | |
| 9,611,544 | B2* | 4/2017 | LaVoie | H01L 21/02164 |
| 2008/0142483 | A1 | 6/2008 | Hua et al. | |
| 2013/0020589 | A1* | 1/2013 | Yu | H01L 33/0093 257/E33.057 |
| 2015/0364611 | A1* | 12/2015 | Funch | H01L 29/0688 257/532 |
| 2019/0043732 | A1* | 2/2019 | Eason | H10B 43/27 |
| 2020/0091224 | A1* | 3/2020 | Bono | H10F 39/103 |

* cited by examiner

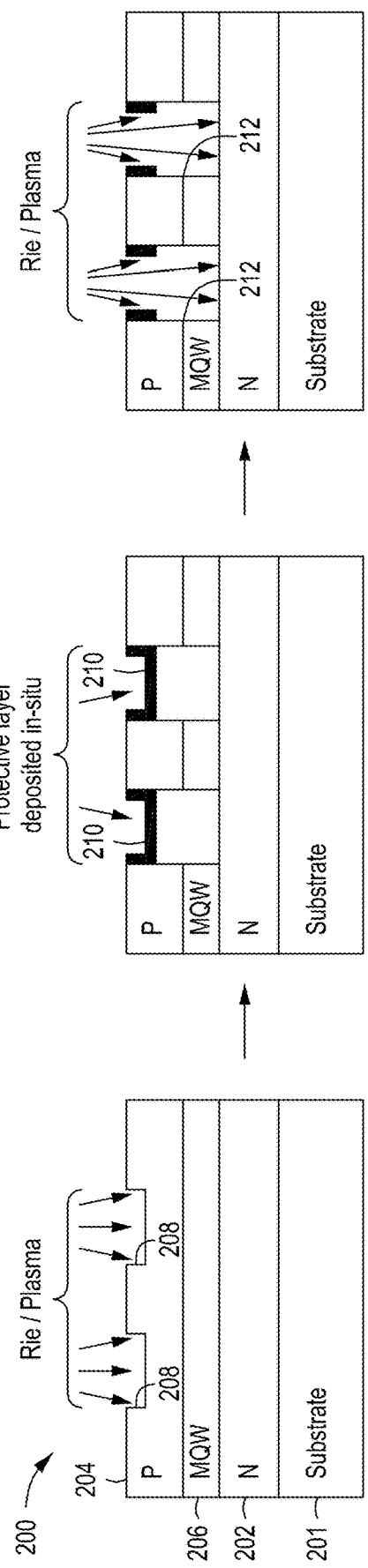
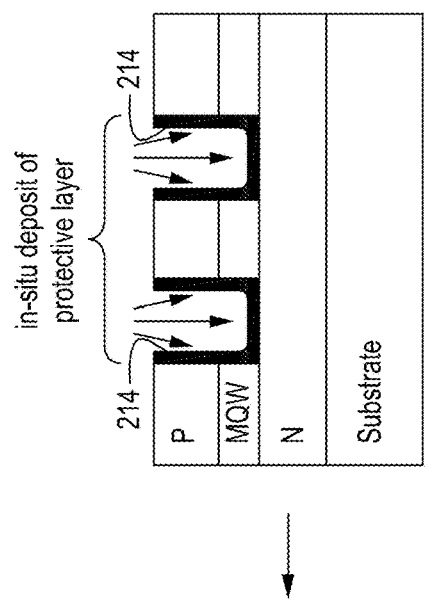
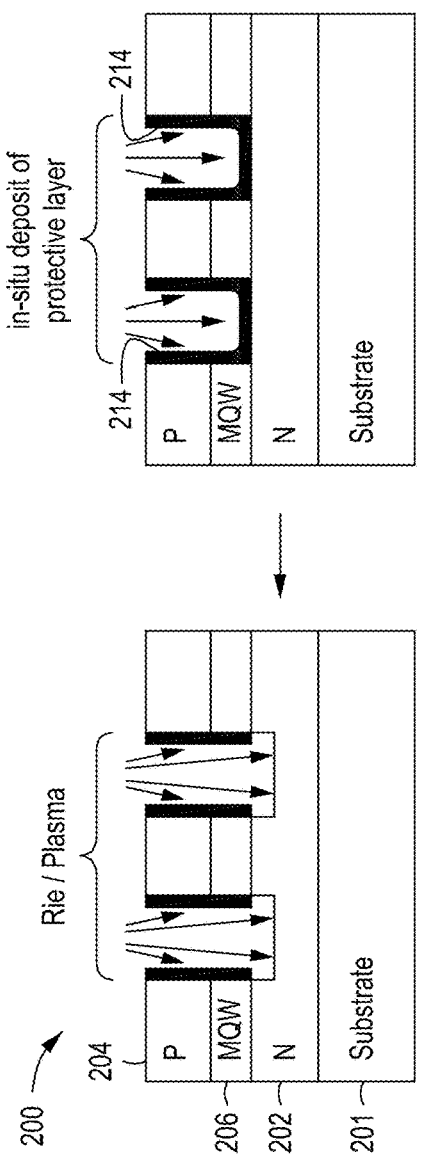

METHODS AND APPARATUS FOR IN-SITU PROTECTION OF ETCHED SURFACES

Embodiments of the present disclosure generally relate to a methods and apparatus for processing a substrate.

BACKGROUND

Plasma etching processes (e.g., reactive-ion etching (RIE)) used for etching substrates (e.g., semiconductor devices or layers) are a known. During plasma etching, however, etched sidewalls of a substrate to which the plasma etching is being performed can become charged as a result of the plasma, which, in turn, can result in surface damage to the sidewalls. Conventional methods and apparatus sometimes deposit a passivation layer after the etching process is completed to try and recover the surfaces of the sidewalls. The effectiveness of using such methods and apparatus can depend on the material being etched, amount of surface damage to the sidewalls, and an efficacy of the passivation layer in neutralizing surface charges of the sidewalls. Moreover, passivation is a relatively complex process that can increase overall semiconductor device fabrication cost.

SUMMARY

Methods and apparatus for processing a substrate are provided herein. For example, in some embodiments, a method of processing a photonic device includes etching, using a plasma etch process that uses a first gas, a first epitaxial layer of material of the photonic device comprising a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$), depositing, using a plasma deposition process that uses a second gas different from the first gas, a first dielectric layer over etched sidewalls of the first epitaxial layer of material, etching, using the first gas, a second epitaxial layer of material of the photonic device, and depositing, using the second gas, a second dielectric layer over etched sidewalls of the second epitaxial layer of material.

In accordance with at least some embodiments, a non-transitory computer readable storage medium having instructions stored thereon that, when executed by a processor, perform a method of processing a photonic device having one or more epitaxially deposited layers. The method includes etching, using a plasma etch process that uses a first gas, a first epitaxial layer of material of the photonic device comprising a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$), depositing, using a plasma deposition process that uses a second gas different from the first gas, a first dielectric layer over etched sidewalls of the first epitaxial layer of material, etching, using the first gas, a second epitaxial layer of material of the photonic device, and depositing, using the second gas, a second dielectric layer over etched sidewalls of the second epitaxial layer of material.

In accordance with at least some embodiments, an apparatus for processing a photonic device having one or more epitaxially deposited layers includes a plasma processing chamber configured to etch, using a first gas, a first epitaxial layer of material and a second epitaxial layer of material of the photonic device, the photonic device comprising a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$), and deposit, using a second gas different from the first gas, a first dielectric layer over etched sidewalls of the first epitaxial layer of material and a second dielectric layer over etched sidewalls of the second epitaxial layer of material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 2A-2E are diagrams of a substrate in accordance with at least some embodiments of the present disclosure.

Figure 1:
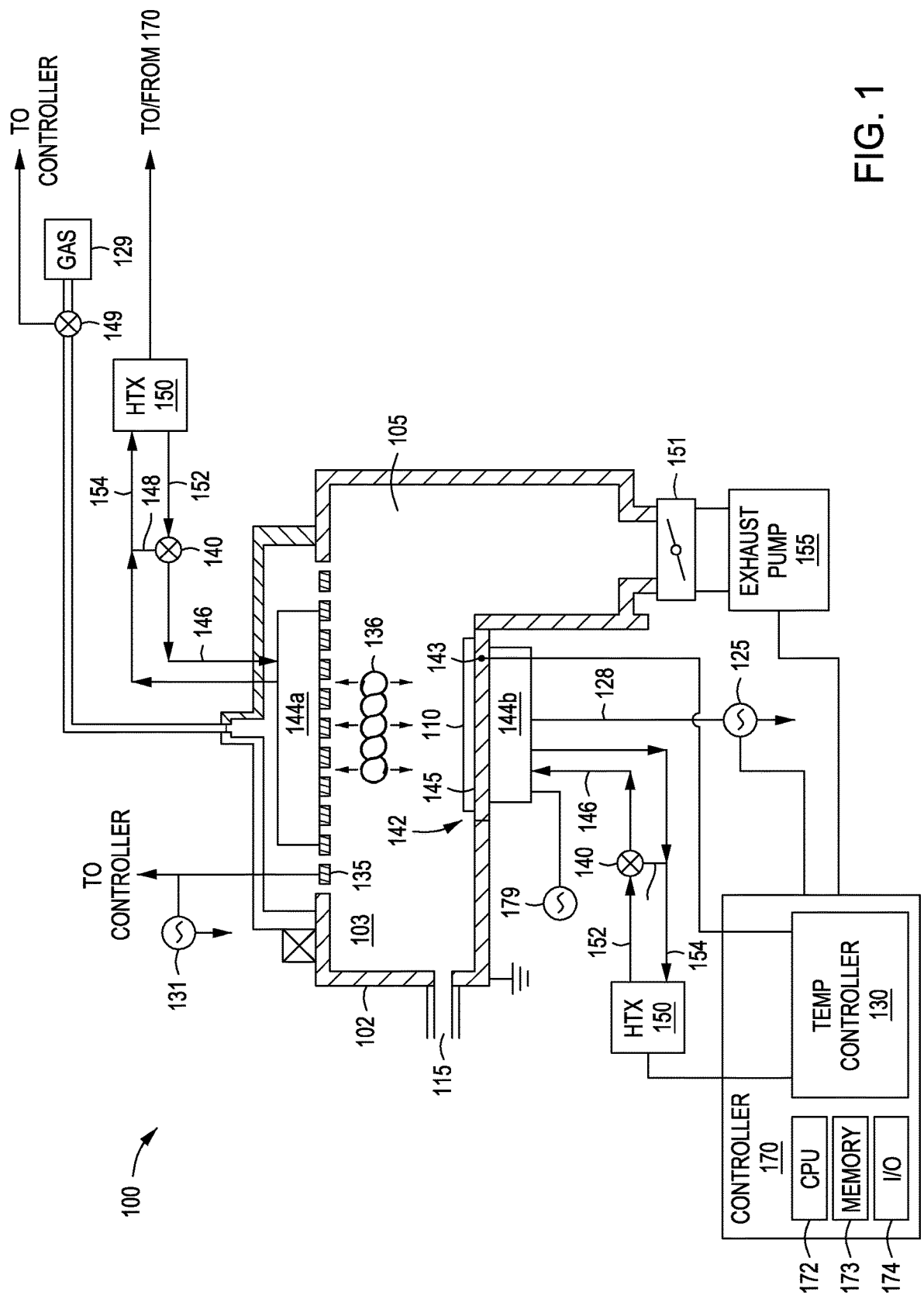
FIG. 1 is a schematic side view of a system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for in-situ protection of etched surfaces are provided herein. For example, in at least some embodiments, one or more dielectric layers of material can be periodically deposited in-situ during an etching process performed on one or more layers of material disposed on a substrate (e.g., semiconductor layers used to form semiconductor devices such as photonic devices including, but not limited to, LEDs, lasers, photodetector, solar cells, and the like, which can have high aspect ratio etch features). The one or more dielectric layers are configured to cover the sidewalls of the feature being etched into the substrate, thus protecting the previously etched sidewalls from being exposed to plasma used as the etching process continues to form the feature. The methods and apparatus described herein can create substrates with minimal to no damage to the sidewalls during an etching process thereto and can reduce, if not eliminate the need to separately deposit a passivation layer. Additionally, mitigating surface damage on the substrate sidewalls can improve quantum efficiencies of photonic devices. Moreover, periodically depositing the dielectric layers of material on the etched surfaces of the sidewall during the etching process avoids creating charged surfaces on the etched sidewalls near the active region (e.g., multiple quantum wells (MQW)) of the substrate (e.g., semiconductor device or photonic device).

FIG. 1 is a schematic of a system 100 in accordance with at least some embodiments of the present disclosure. The system 100 can be configured to perform one or more plasma processes on a substrate in a single processing chamber. e.g., a plasma processing chamber. For example, the system 100 can include plasma processing chamber configured to perform one or more etching processes (e.g., a reactive ion etch process) and to perform one or more plasma deposition processes (e.g., chemical vapor deposition).

The system 100 includes a processing chamber 102 including a chamber body 105, which can be grounded. Process gases are supplied from a gas source(s) 129 connected to the chamber body 105 through a mass flow controller 149 to an inner volume 103 (e.g., a processing region) of the processing chamber 102.

The processing chamber 102 can be evacuated via an exhaust valve 151 connected to a high capacity vacuum pump 155. When plasma power is applied to the processing chamber 102, a plasma 136 can be formed in the inner volume 103 over a substrate 110 to perform an etching process and/or a plasma deposition process.

A plasma bias source 125 (e.g., RF power source or DC power source) is coupled to an electrostatic chuck (ESC) 142 to energize the plasma. In at least some embodiments, the plasma bias source 125 is an RF power source. The plasma bias source 125 can provide bias power at a frequency from about 400 kHz to about 60 MHz, and may be, for example, at about 13.56 MHz. The plasma bias source 125 can be coupled to an RF match network (not shown) and to a lower electrode (not shown, e.g., a chucking electrode) via a power conduit 128. Additionally, in at least some embodiments, the processing chamber 102 can include a second plasma bias power (not shown, e.g., RF power source or DC power source). For example, if the second plasma source is a second RF power source, the second RF power source can also be connected to the RF match network. The second plasma bias power can operate at about 2 MHz to about 60 MHz. and may be, for example, at about 2 MHz.

A plasma source power 131 is coupled through another match network (not shown) to provide high frequency source power to inductively or capacitively energize the plasma 136. The plasma source power 131 may have a higher frequency than the plasma bias source 125, such as between 100 and 180 MHz, and may, for example, be about 162 MHz. In at least some embodiments, the plasma can be created using one or more gases suitable for performing a plasma etch process and/or a plasma deposition process (e.g., argon, bromine, carbon, chlorine, nitrogen, oxygen, or other suitable gas). The plasma is directed to a surface of the substrate 110 via, for example, a source 135 (e.g., a showerhead).

The substrate 110 can be loaded through an opening 115 defined through the chamber body 105. The substrate 110 (e.g., such as a semiconductor wafer or die) may be any wafer, substrate, or other material employed in the semiconductor processing art. For example, in at least some embodiments, the substrate can include layers of p-type material and n-type material that can be disposed near active regions (e.g., MQW) of the substrate 110. The substrate 110 can be loaded onto a top surface of a dielectric layer 145 of the ESC 142. A clamp electrode (not shown) can be embedded in the dielectric layer 145 and can be coupled to a source of bias power 179 to provide an electrostatic force to clamp the substrate 110 to the dielectric layer 145.

One or more cooling plates can be provided on one or more components of the processing chamber 102. For illustrative purposes, cooling plates 144a, 144b are shown provided respectively on the source 135 and the ESC 142. The cooling plates 144a, 144b can include one or more coolant channels (not shown) that receive coolant via one or more inlet channels (not shown) and that release the coolant via one or more output channels (not shown). In at least some embodiments, the inlet channel, which is connected to a coolant supply line 152 of a heat exchanger 150, is connected to the first coolant output line 146 of a proportional bypass valve (PBV) 140 for receiving the coolant and the output channel is connected to a coolant return line 154 of the heat exchanger 150, which is connected to the second coolant output line 148 of the PBV 140. In at least some embodiments, the each of the cooling plates 144a, 144b can be connected to the same heat exchanger 150 (HTX/chillers), as illustrated in FIG. 1. Alternatively, each of the cooling plates 144a, 144b can be connected to separate heat exchangers. A flow rate of the thermal fluid or heat transfer fluid (e.g., coolant) through the one or more coolant channels in the cooling plates 144a, 144b of the source 135 and ESC 142 is controlled by the PBV 140.

A temperature controller 130 is coupled to the heat exchanger 150 and the PBV 140. For example, the PBV 140 can be controlled by the temperature controller 130 to independently control a rate of flow of the coolant to each of the one or more coolant channels in the cooling plates 144a, 144b. The temperature controller 130 may also control the temperature set point used by the heat exchanger 150 to cool or heat the thermal fluid. The temperature controller 130 is also coupled to one or more temperature sensors (probes) 143, which may be in or on an upper plate (not shown) of the ESC 142.

To facilitate control of the processing chamber 102, the processing chamber 102 includes a controller 170. The controller 170 includes a central processing unit (CPU) 172, which may be one of any form of general-purpose computer processor that can be used in an industrial setting, such as a programmable logic controller (PLC), for controlling various chambers and sub-processors. A memory 173 is coupled to the CPU 172, and the memory 173 can be non-transitory computer readable storage medium and may be one or more of readily available memory such as random access memory (RAM), read only memory (ROM), floppy disk drive, hard disk, or any other form of digital storage, local or remote. Support circuits 174 (e.g., I/O circuits) including one or more of power supplies, clocks, cache, etc. are coupled to the CPU 172 for supporting the processor in a conventional manner. Charged species generation, heating, and other processes are generally stored in the memory 173, typically as software routine. The software routine may also be stored and/or executed by a second CPU (not shown) that is remotely located from the processing chamber 102 being controlled by the CPU 172.

The memory 173 is in the form of non-transitory computer-readable storage media that contains instructions which when executed by the CPU 172 facilitates the operation of the processing chamber 102 (e.g., perform a method of processing a substrate). The instructions in the memory 173 are in the form of a program product such as program code that implements the methods described herein. The program code may conform to any one of a number of different programming languages. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Additionally, the controller 170 is configured to perform etch control and deposition control using one or more control algorithms which can be stored in the memory 173. For example, in at least some embodiments, etch control and deposition control algorithms used by the controller 170 can be configured to control an etch depth into one or more layers of a substrate, a thickness of a material to be deposited atop/on one or more layers (e.g., a top layer, bottom layer, an exposed sidewall, etc.) of a substrate, deposition angles, flow rate of process gas(es) used for etching and/or deposition, gas flow sequencing, process chamber pressure, RF/DC power, RF/DC bias, etc., as described in greater detail below.

Figure 3:
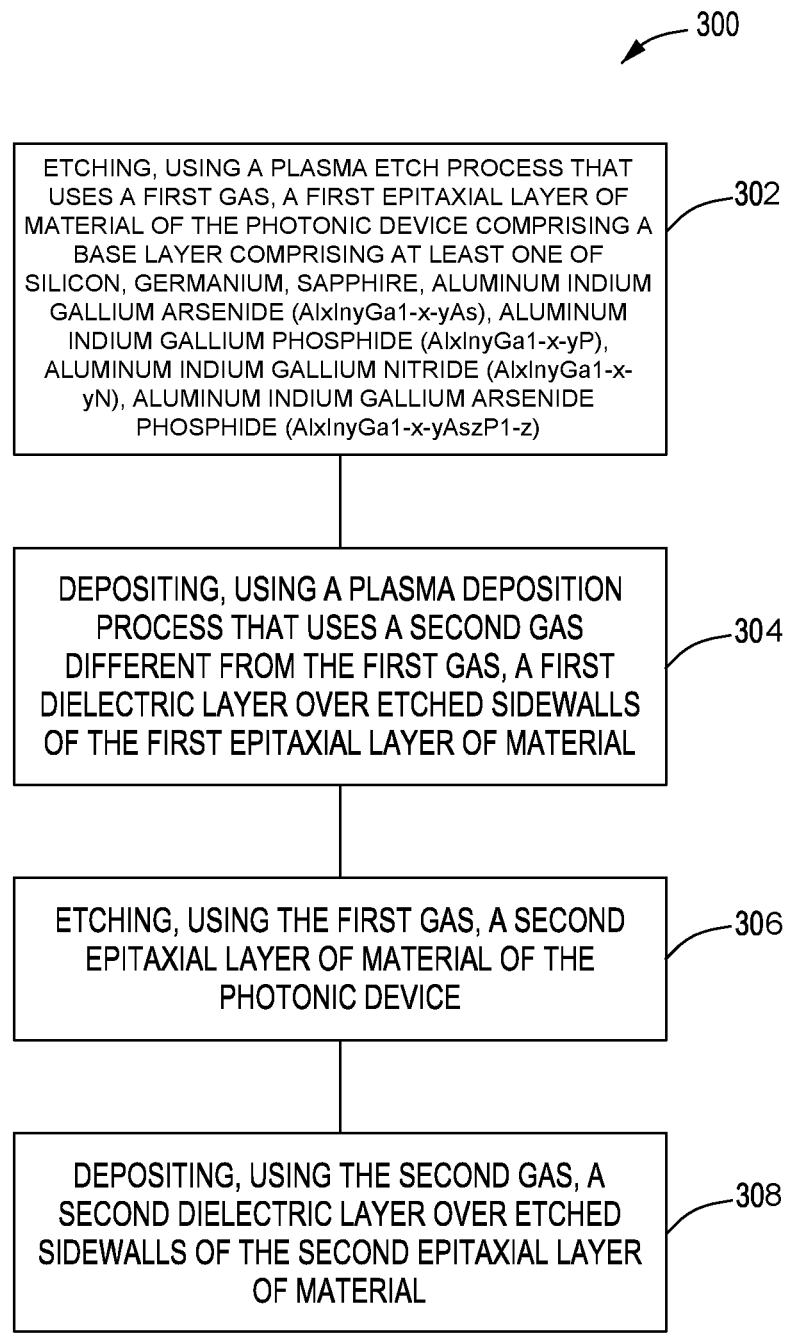
FIG. 3 is a flowchart of a method for processing the substrate of FIG. 2 in accordance with at least some embodiments of the present disclosure.

FIGS. 2A-2E are diagrams of a substrate 200 (e.g., a semiconductor device comprising epitaxially deposited layers) in accordance with at least some embodiments of the present disclosure, and FIG. 3 is a flowchart of a method 300 for processing the substrate 200 (e.g., processing a photonic device, such as creating trenches between adjacent photonic devices) of FIG. 2 in accordance with at least some embodiments of the present disclosure. In at least some embodiments, the method 300 can be used for accessing a contact layer or for singulating a die on a substrate (wafer). For illustrative purposes, the method 300 is described herein using the system 100 of FIG. 1, which is configured to perform both an etching process and deposition process in a single processing chamber for processing the semiconductor device, thus mitigating the impact of sidewall etch damage on an optical efficiency of an optical device As noted above, one or more variables can be controlled, for example, by the controller 170, to optimize the method 300. For example, a type of process gas(es) used, RF/DC power, RF/DC bias, process chamber pressure, etch depth, deposition thickness, etc. can all be controlled by the controller 170 to achieve a specific outcome. For example, in at least some embodiments, a sidewall profile and angle can be tuned for a required substrate aspect ratio by adjusting, for example, a gas flow sequencing during an etching process and/or deposition process. In addition to gas flow, reduced pressure and increase ion energy are also key parameters that would further contribute to tuning sidewall profile and angle.

At 302, using a plasma etch process, a first layer of material of the substrate 200 (e.g., a semiconductor wafer or die) comprising a plurality of layers (e.g., a stack) can be etched to form one or more features, e.g., via, trench, dual damascene, etc. The features can be etched into the substrate 200 using a suitable masking layer (not shown), such as a photoresist or hard mask layer. For example, and as depicted in FIG. 2A, in at least some embodiments, the substrate 200 can include a layer of p-type material 204 (e.g., a first epitaxial layer of material such as aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$)), an active layer 206, e.g., an MQW formed from one or more of the p-type materials 204 such as, for example, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$), and a layer of n-type material 202 (e.g., a second epitaxial layer of material such as aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$)). The layer of n-type material 202, layer of p-type material 204, and active layer 206 can be configured in one or more variations. For example, the layer of p-type material 204 can be a top layer, the layer of n-type material 202 can be a bottom layer disposed atop a base layer 201 (e.g., comprising at least one of silicon, germanium, sapphire, gallium arsenide (GaAs), indium phosphide (InP), etc.) of the substrate 200, and the active layer 206 can be disposed between the n-type material 202 and the layer of p-type material 204. Alternatively, the n-type material 202 can be the top layer and the layer of p-type material 204 can be the bottom layer and the active layer 206 can again be disposed between the n-type material 202 and the layer of p-type material 204. The layer of n-type material 202, layer of p-type material 204, and active layer 206 of the substrate 200 can be used to form one or more photonic devices, e.g., comprising an LED, a laser, a photodetector, a solar cell, or the like. For example, each photonic device comprises an n-layer, an active layer and a p-layer stacked to make a complete photonic device. The materials used in the three layers can be different depending on the photonic device design and application In at least some embodiments, the layer of n-type material 202, layer of p-type material 204, and active layer 206 of the substrate 200 can be epitaxially deposited by known processes. The etch and deposition processes can be controlled by the gases used for each of the etch and deposition processes. For example, the pressure, DC bias, and RF power can be different for the etch and deposition processes, and the times for each of etch and deposition processes can depend on the structure and structure sensitivity to the plasma used during processing. For example, during the etching process and deposition processes, RF power having a frequency of about 162 MHz can be supplied at about 500 W to about 1000 W to ignite a plasma. In some embodiments, RF bias power can be provided at a frequency of about 400 kHz to about 13.56 MHz and can be supplied at about 500 W to about 1000 W to control directionality of the plasma. The RF bias power can be provided in a continuous wave mode or in a pulsed mode. In some embodiments, a pressure within the process chamber can be maintained as about 20 mTorr to about 30 mTorr.

The substrate 200 can be etched using one or more suitable etching processes. For example, the etching process can be a plasma etching process, such as a reactive-ion etch process that uses one or more suitable process gases to form a plasma. In at least some embodiments, the reactive-ion etch process can use a process gases including, but not limited to, at least one of argon (Ar), boron trichloride ($BCl_3$), chlorine ($Cl_2$), or hydrogen bromide (HBr), (e.g., a first gas for forming a plasma), as described in greater detail below.

The first layer of material can be etched to any suitable depth. For example, in at least some embodiments, the etching process at 302 can be configured to etch one or more features partially or totally through the first layer of material. In at least some embodiments, the controller 170 can be configured for end-point detection, e.g., to determine which layer of the stack is being etched to modify etching and/or passivation process conditions. For illustrative purposes, the etching process at 302 is configured to etch partially through the layer of p-type material 204 (see FIG. 2A, for example). Additionally, as noted above, a profile and angle of sidewalls 208 formed during 302 can be tuned for a required substrate aspect ratio by adjusting, for example, a gas flow sequencing during 302.

The reactive-ion etch process at 302 can use one or more suitable etch recipes. For example, one or more of the above process gases (Ar), boron trichloride ($BCl_3$), chlorine ($Cl_2$), or hydrogen bromide (HBr) can be supplied at one or more suitable flow rates for a predetermined time. In at least some embodiments, the process gas can be at least one of Ar, $BCl_3$, $Cl_2$, or HBr that can be supplied at a flow rate of about 50 sccm to about 200 sccm, which can be supplied for about 3 seconds to about 6 seconds. In at least some embodiments, the process gas at 302 can be supplied in intervals. For example, one or more of Ar, $BCl_3$, $Cl_2$, or HBr can be initially supplied at a first flow rate for a first predetermined time and subsequently one or more of Ar, $BCl_3$, $Cl_2$, or HBr can be supplied at a second flow rate for a second predetermined time. The first flow rate and the second flow rate can be the same or different from each other. Likewise, the first predetermined time and the second predetermined time can be the same or different from each other. For example, in one particular embodiment, etching comprises reactive-ion etching including supplying at least one of one $BCl_3$, $Cl_2$, or HBr at a flow rate equal to or greater than about 50 sccm for about 3 seconds, and subsequently or simultaneously supplying Ar at a flow rate equal to or greater than about 50 sccm for about 3 seconds. By controlling an RF bias at the substrate, directionality of the $BCl_3$, $Cl_2$, or HBr ions can be controlled toward a bottom of the features in the substrate, as shown by the directional arrows in FIGS. 2C-2D.

Next, at 304 and as depicted in FIG. 2B, a protective layer of one or more materials can be deposited over etched (e.g., exposed) sidewalls of the one or more features formed in the first layer of material (e.g., to cover the layer of p-type material 204). The inventors have found that depositing a protective layer of the one or more materials over the etched sidewalls (e.g., sidewalls 208) of the layer of p-type material 204 can protect the sidewalls 208 during the etching process. For example, the protective layer can be configured to cover the etched sidewalls of the substrate 200, thus protecting the etched sidewalls from being exposed to the plasma used during the etching process. In at least some embodiments, the protective layer can be a dielectric layer 210 (e.g., a first dielectric layer). The dielectric materials used to form the dielectric layer 210 can be any suitable dielectric material including carbon, silicon, nitrogen, gallium, oxide, aluminum oxide, and combinations thereof. In at least some embodiments, the dielectric layer 210 can be a carbon film layer, a polymer layer (e.g., linear, branched, crosslinked, or networked), or an oxidation mask layer (e.g., silicon, silicon oxide, silicon nitride, and the like). The dielectric layer 210 can deposited using one or more suitable deposition processes, such as physical vapor deposition, chemical vapor deposition, or atomic layer deposition. In at least some embodiments, the dielectric layer 210 can deposited using chemical vapor deposition. The dielectric layer 210 can be deposited to a thickness that provides adequate coverage of the sidewalls 208 (e.g., a thickness to cover the etched sidewalls of the first layer of material and the etched sidewalls of the second layer). The thickness of the dielectric layer can depend on the etch depth of the dielectric layer and can be about few nanometers to few hundred nanometers.

The deposition process at 304 can use one or more suitable deposition recipes (e.g., using one of octafluorocyclobutane ($C_4F_8$) or oxygen ($O_2$)). For example, in at least some embodiments, e.g., when 304 includes depositing a carbon film layer, the process gas can be octafluorocyclobutane (or perfluorocyclobutane) ($C_4F_8$) that can be supplied at a flow rate of about 50 sccm to about 150 sccm, which can be supplied for about 2 seconds to about 5 seconds. In at least some embodiments, such as when 304 includes depositing an oxidation mask, oxygen gas ($O_2$), along with a silicon precursor and optionally a nitrogen gas can be supplied at a total flow rate of about 50 sccm for about 5 seconds (e.g., to create thin oxide dielectric layers. A thinness of the dielectric layers can depend on one or more factors, such as etch chemistry used, photonic device structure, and/or composition of the n-type material 202, layer of p-type material 204, and active layer 206.

Next, at 306 and as depicted in FIG. 2C, a second layer of material of the substrate can be etched. For example, in at least some embodiments, the second layer or material can be the active layer 206. Alternatively, the second layer of material can be the n-type material 202, such as when the active layer 206 is not present. In at least some embodiments, the same etching process used at 302 can be used at 306. Alternatively, a different etching process can be used at 306. The etch process at 306 can be achieved using different gases and plasma conditions, such as bias, RF power and pressure, compared to 302. As noted above, the etching process at 306 can be configured to etch partially or totally through a layer of material. For illustrative purposes, the etching process at 306 is configured to finish etching through the p-type material 204 and totally through the active layer 206, thus exposing sidewalls 212 that include the remaining portions of the p-type material 204 and the active layer 206 (see FIG. 2C).

Next, at 308 and as depicted in FIG. 2D, a dielectric layer 214 (e.g., a second dielectric layer) can be deposited over etched sidewalls of the second layer of material, e.g., sidewalls 212 that include the remaining portions of the p-type material 204 and the active layer 206, in a manner as described above with respect to 304 (see FIG. 2D). In at least some embodiments, the same deposition process used at 304 can be used at 308. Alternatively, a different deposition process can be used at 308. For example, in at least some embodiments, the dielectric layer 210 and the dielectric layer 214 can be formed from the same material (e.g., $C_4F_8$). Alternatively, the dielectric layer 210 and the dielectric layer 214 can be formed from a different material (e.g., the dielectric layer 210 can be a polymer layer formed using $C_4F_8$ and the dielectric layer 214 can be an oxide layer formed using $O_2$, or vice versa).

The process continues until a desired depth of etching is reached through the substrate 200. For example, as illustrated in FIG. 2E the etching process can continue into a third layer of material (e.g., the layer of n-type material 202), or in some embodiments the etching process can continue to or into the base layer of the substrate 200. Additionally, after each etching process, a dielectric layer can be deposited to cover the exposed sidewalls of a corresponding layer of material, e.g., 302-308 can be repeated as desired until the desired depth of etching is reached through the substrate 200.

During 302-308, the controller 170 can be configured to control one or more of the above-described variables to optimize (e.g., to achieve a balance of sidewall protection and etch depth) the method 300. For example, the controller 170 can control which type of process gas(es) are used during 302 and 306. For example, the controller 170 can use BCl$_3$ gas at 302 and Cl$_2$ or HBr gas at 306, and while performing 302 and 306 the controller 170 can vary one or more of the RF/DC power, RF/DC bias, gas flow rate and/or time, and/or process chamber pressure to control an etch depth. Similarly, the controller 170 can control which type of process gas(es) are used during 304 and 308. For example, while performing 304 and 308 the controller 170 can vary one or more of the RF/DC power, RF/DC bias, gas flow rate and/or time, and/or process chamber pressure to control a deposition thickness. Additionally, in at least some embodiments, a sidewall profile and angle can be tuned for a required substrate aspect ratio by adjusting, for example, a gas flow sequencing during 302-308. For example, in at least some embodiments, using carbon source or oxygen can dictate the type of deposition created for sidewall protection purposes. The combination of the gas and step time used can modulate the deposition layer thickness.

In at least some embodiments, after the substrate 200 has been etched to a desired depth, the dielectric layers can be removed using one or more conventional removal apparatus and removal processes, e.g., HF dilute wet etching apparatus/process (buffer HF dip). For example, in the illustrated embodiment, after the n-type material has been etched, the dielectric layer 210 and the dielectric layer 214 can be removed from the sidewall 208 and the sidewall 212, and the substrate 200 can be further processed as needed, e.g., to continue fabrication of structure and/or devices on the substrate 200.

Figure 4A:
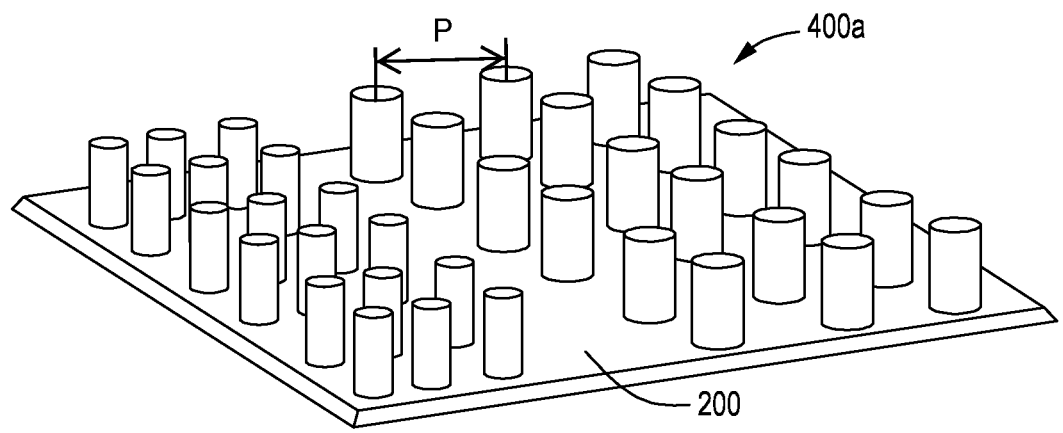
FIGS. 4A and 4B are diagrams of photonic devices fabricated using the method of FIG. 3 in accordance with at least some embodiments of the present disclosure.
Figure 4B:
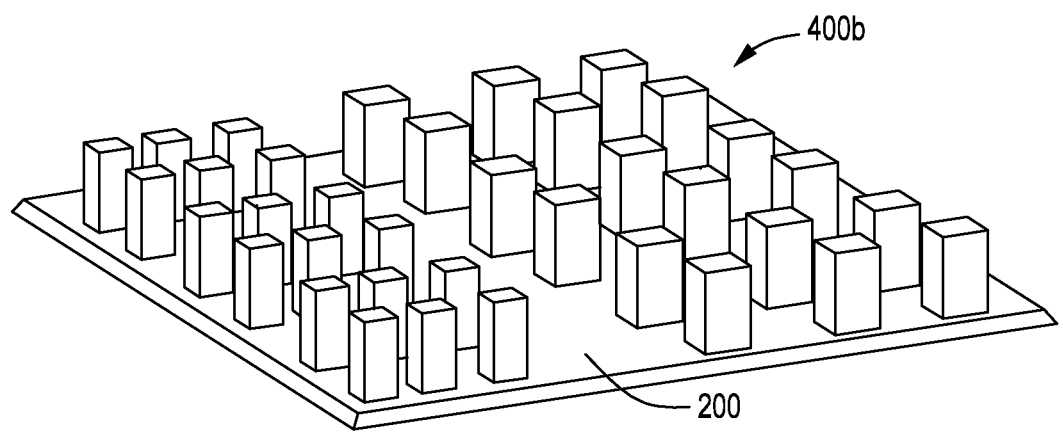

FIGS. 4A and 4B are diagrams of photonic devices fabricated using the method of FIG. 3 in accordance with at least some embodiments of the present disclosure. For example, FIGS. 4A and 4B illustrate a plurality of circular die 400a and rectangular die 400b, respectively. In at least some embodiments, the plurality of circular die 400a and rectangular die 400b can be one or more of the above described photonic devices (e.g., an LED, a laser, a photodetector, a solar cell, or the like). For example, in embodiments, the plurality of circular die 400a and rectangular die 400b can be a plurality of circular uLEDs and a plurality of rectangular uLEDs, respectively. Each pillar of circular LEDs and rectangular LEDs can comprise a single or multiple light emitting elements. Each pillar of the plurality of circular LEDs and rectangular LEDs can have a die size of sub-micron to about several millimeters (e.g., less than 1 μm to about 10 mm) and a pitch (e.g., a spacing between the centers of two adjacent pillars) of sub-micron to several hundred microns (e.g., less than 1 μm to about 700 μm). In at least some embodiments, after the pillars of circular LEDs and rectangular LEDs are fabricated using the method 300, each of the pillars, e.g., after singulation, becomes an independent die that can be, for example, transferred onto display backplanes.

While the foregoing is directed to embodiments of the present disclosure, other and further embodiments of the disclosure may be devised without departing from the basic scope thereof.

The invention claimed is:

1. A method of processing a photonic device, comprising:
    etching, using a plasma etch process that uses a first gas, a first epitaxial layer of material of the photonic device to form a feature in the first epitaxial layer having etched sidewalls, wherein the photonic device comprises a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$);
    depositing, using a plasma deposition process that uses a second gas different from the first gas, a first dielectric layer in direct contact with the etched sidewalls of the feature formed in the first epitaxial layer of material to cover the etched sidewalls of the feature formed in the first epitaxial layer of material;
    exposing a second epitaxial layer of material of the photonic device disposed below the first epitaxial layer by etching, using the first gas, through the first dielectric layer deposited in the feature, to form the etched sidewalls of the feature in the second epitaxial layer to expose the second epitaxial layer of material, wherein at least a portion of the first dielectric layer deposited in contact with the etched sidewalls of the feature formed in the first epitaxial layer of material is present after exposing the second epitaxial layer of material; and
    depositing, using the second gas, a second dielectric layer in direct contact with the etched sidewalls of the second epitaxial layer of material, wherein the base layer is different from both the first epitaxial layer and the second epitaxial layer in that the base layer is not etched during etching of the first epitaxial layer and the second epitaxial layer.

2. The method of claim 1, wherein etching comprises reactive-ion etching including using at least one of argon (Ar), boron trichloride (BCl$_3$), chlorine (Cl$_2$), or hydrogen bromide (HBr), and wherein depositing comprises using one of octafluorocyclobutane (C$_4$F$_8$) or oxygen (O$_2$).

3. The method of claim 1, wherein etching comprises supplying the first gas at a flow rate of about 150 sccm to about 200 sccm for about 3 seconds, and wherein depositing comprises supplying the second gas at a flow rate of about 100 sccm to about 150 sccm for about 2 seconds.

4. The method of claim 1, wherein etching comprises reactive-ion etching including supplying at least one of one BCl$_3$, Cl$_2$, of HBr at a flow rate equal to or greater than about 50 sccm for about 3 seconds, and one of simultaneously or subsequently supplying Ar at a flow rate equal to or greater than about 50 sccm for about 3 seconds.

5. The method of claim 1, wherein depositing the first dielectric layer and the second dielectric layer comprises depositing at least one of a carbon film layer, a polymer layer, or an oxidation mask layer.

6. The method of claim 1, wherein etching the first epitaxial layer of material and the second epitaxial layer of material comprises etching one of a p-type material, an n-type material, or a multiple quantum well, and wherein the first epitaxial layer of material is different from the second epitaxial layer of material.

7. The method of claim 1, further comprising processing the photonic device to form one of an LED, a laser, a photodetector, or a solar cell.

8. The method of claim 1, further comprising removing at least one of the first dielectric layer or the second dielectric layer after both the first epitaxial layer of material and the second epitaxial layer of material have been etched.

9. The method of claim 1, wherein the first dielectric layer and the second dielectric layer comprises carbon, silicon, nitrogen, gallium, oxygen (O$_2$), or aluminum oxide and are deposited in contact with the etched sidewalls of the first epitaxial layer of material and the etched sidewalls of the second epitaxial layer of material to cover the etched sidewalls of the first epitaxial layer of material and the etched sidewalls of the second epitaxial layer of material.

10. A non-transitory computer readable storage medium having instructions stored thereon that, when executed by a processor, perform a method of processing a photonic device having one or more epitaxially deposited layers, the method comprising:

etching, using a plasma etch process that uses a first gas, a first epitaxial layer of material of the photonic device to form a feature in the first epitaxial layer having etched sidewalls, wherein the photonic device comprises a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$);

depositing, using a plasma deposition process that uses a second gas different from the first gas, a first dielectric layer in direct contact with the etched sidewalls of the feature formed in the first epitaxial layer of material to cover the etched sidewalls of the feature formed in the first epitaxial layer of material;

exposing a second epitaxial layer of material of the photonic device disposed below the first epitaxial layer by etching, using the first gas, through the first dielectric layer deposited in the feature, to form the etched sidewalls of the feature in the second epitaxial layer to expose the second epitaxial layer of material, wherein at least a portion of the first dielectric layer deposited in contact with the etched sidewalls of the feature formed in the first epitaxial layer of material is present after exposing the second epitaxial layer of material; and depositing, using the second gas, a second dielectric layer in direct contact with the etched sidewalls of the second epitaxial layer of material, wherein the base layer is different from both the first epitaxial layer and the second epitaxial layer in that the base layer is not etched during etching of the first epitaxial layer and the second epitaxial layer.

11. The non-transitory computer readable storage medium of claim 10, wherein etching comprises reactive-ion etching including using at least one of argon (Ar), boron trichloride ($BCl_3$), chlorine ($Cl_2$), or hydrogen bromide (HBr), and wherein depositing comprises using one of octafluorocyclobutane ($C_4F_8$) or oxygen ($O_2$).

12. The non-transitory computer readable storage medium of claim 10, wherein etching comprises supplying the first gas at a flow rate of about 150 sccm to about 200 sccm for about 3 seconds, and wherein depositing comprises supplying the second gas at a flow rate of about 100 sccm to about 150 sccm for about 2 seconds.

13. The non-transitory computer readable storage medium of claim 10, wherein etching comprises reactive-ion etching including supplying at least one of one $BCl_3$, $Cl_2$, of HBr at a flow rate equal to or greater than about 50 sccm for about 3 seconds, and one of simultaneously or subsequently supplying Ar at a flow rate equal to or greater than about 50 sccm for about 3 seconds.

14. The non-transitory computer readable storage medium of claim 10, wherein depositing the first dielectric layer and the second dielectric layer comprises depositing at least one of a carbon film layer, a polymer layer, or an oxidation mask layer.

15. The non-transitory computer readable storage medium of claim 10, wherein etching the first epitaxial layer of material and the second epitaxial layer of material comprises etching one of a p-type material, an n-type material, or a multiple quantum well, and wherein the first epitaxial layer of material is different from the second epitaxial layer of material.

16. The non-transitory computer readable storage medium of claim 10, wherein etching the first epitaxial layer of material and the second epitaxial layer of material comprises etching one of a p-type material, an n-type material, or a multiple quantum well, and wherein the first epitaxial layer of material is different from the second epitaxial layer of material.

17. The non-transitory computer readable storage medium of claim 10, further comprising processing the photonic device to form one of an LED, a laser, a photodetector, or a solar cell.

18. The non-transitory computer readable storage medium of claim 10, further comprising removing at least one of the first dielectric layer or the second dielectric layer after both the first epitaxial layer of material and the second epitaxial layer of material have been etched.

19. The non-transitory computer readable storage medium of claim 10, wherein the first dielectric layer and the second dielectric layer comprises carbon, oxygen, silicon, nitrogen, gallium, oxide ($O_2$), or aluminum oxide and are deposited in contact with the etched sidewalls of the first epitaxial layer of material and the etched sidewalls of the second epitaxial layer of material to cover the etched sidewalls of the first epitaxial layer of material and the etched sidewalls of the second epitaxial layer of material.

20. An apparatus for processing a photonic device having one or more epitaxially deposited layers, comprising:

a plasma processing chamber configured to:

etch, using a first gas, a first epitaxial layer of material and a second epitaxial layer of material of the photonic device, the photonic device to form a feature in the first epitaxial layer having etched sidewalls, wherein the photonic device comprises a base layer comprising at least one of silicon, germanium, sapphire, aluminum indium gallium arsenide ($Al_xIn_yGa_{1-x-y}As$), aluminum indium gallium phosphide ($Al_xIn_yGa_{1-x-y}P$), aluminum indium gallium nitride ($Al_xIn_yGa_{1-x-y}N$), aluminum indium gallium arsenide phosphide ($Al_xIn_yGa_{1-x-y}As_zP_{1-z}$);

deposit, using a plasma deposition process that uses a second gas different from the first gas, a first dielectric layer in direct contact with the etched sidewalls of the first epitaxial layer of material to cover the etched sidewalls of the feature formed in the first epitaxial layer of material;

expose the second epitaxial layer of material of the photonic device disposed below the first epitaxial layer by etching, using the first gas, through the first dielectric layer deposited in the feature, to form the etched sidewalls of the feature in the second epitaxial layer to expose the second epitaxial layer of material, wherein at least a portion of the first dielectric layer deposited in contact with the etched sidewalls of the feature formed in the first epitaxial layer of material is present after exposing the second epitaxial layer of material; and deposit using the second gas, a second dielectric layer in direct contact with the etched sidewalls of the second epitaxial layer of material, wherein the base layer is different from both the first epitaxial layer and the second epitaxial layer in that the base layer is not etched during etching of the first epitaxial layer and the second epitaxial layer.

* * * * *